(12) United States Patent
Yoshizumi et al.

(10) Patent No.: US 7,896,535 B2
(45) Date of Patent: Mar. 1, 2011

(54) DISPLAY MODULE

(75) Inventors: Takahisa Yoshizumi, Fukuoka (JP);
Kazunori Omori, Fukuoka (JP);
Yasuhisa Kanemaru, Fukuoka (JP);
Tsutomu Takahashi, Kawasaki (JP);
Hideki Zenitani, Hachioji (JP)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 12/238,800

(22) Filed: Sep. 26, 2008

(65) Prior Publication Data
US 2009/0086418 A1   Apr. 2, 2009

(30) Foreign Application Priority Data
Sep. 28, 2007  (JP) .................................. 2007-256269

(51) Int. Cl.
*F21V 7/04* (2006.01)
(52) U.S. Cl. ........................................ 362/632; 362/269
(58) Field of Classification Search .................. 362/632, 362/633, 269, 285, 561; 455/575.1, 90.1, 455/550.1
See application file for complete search history.

(56) References Cited

U.S. PATENT DOCUMENTS

| | | | | |
|---|---|---|---|---|
| 5,704,094 | A * | 1/1998 | Hartigan et al. | 16/303 |
| 6,999,801 | B2 * | 2/2006 | Cheng et al. | 455/575.1 |
| 7,324,092 | B2 * | 1/2008 | Lin et al. | 345/169 |

FOREIGN PATENT DOCUMENTS

| | | |
|---|---|---|
| JP | 6-33502 Y2 | 8/1994 |
| JP | 1-1251761 A | 9/1999 |

* cited by examiner

*Primary Examiner* — Ali Alavi
(74) *Attorney, Agent, or Firm* — Westerman, Hattori, Daniels & Adrian, LLP

(57) ABSTRACT

A display module includes: a display unit having a display screen for displaying information; a display unit housing including a transparent front cover covering a display screen of the display unit, and a pair of side covers covering both sides of the display unit, wherein the display unit is attached to the display unit housing so as to be detachable; and shafts projecting outwards from the pair of side covers and supported so as to be freely rotatable when fitted in a pair of supporting holes made in a housing provided for an apparatus.

7 Claims, 11 Drawing Sheets

DISPLAY MODULE

CROSS-REFERENCE TO RELATED APPLICATIONS

This application is based upon and claims the benefit of priority of the prior Japanese Patent Application No. 2007-256269, filed on Sep. 28, 2007 the entire contents of which are incorporated herein by reference.

TECHNICAL FIELD

The embodiment relates to a display module having a display unit for displaying information, and supported by a housing like that of a communication apparatus and the like so as to be freely rotatable.

BACKGROUND

Display modules for displaying information are attached to apparatus housings in various fields.

For example, a communication apparatus connected to optical fiber cables is equipped with a display module that displays by the illumination of an LED the wavelength of the optical signal being transmitted through the optical fiber.

FIG. 1 shows an example of a communication apparatus connected to optical fibers.

A communication apparatus 10 described here is housed in the apparatus housing 11, and a plurality of optical cables 13 for transmission of optical signals is connected to the apparatus 10. A display module 14 is disposed on the optical cables 13 at its root on a side of the apparatus housing 11. The display module 14 includes a plurality of LED segments disposed in an array for displaying the wavelength of an optical signal transmitted through the optical cables 13. The optical cables 13 may be moved upward or downward to a certain extent, and the freely rotatable display module 14 is supported by the apparatus housing 11 so as not to hinder the movement of the optical cables 13.

FIG. 2 is an exploded perspective view of the display module shown in FIG. 1.

The display module 14 includes a display unit 15 and a housing 16 for the display unit. The display unit 15 includes a display screen 151 having the LED segments disposed in an array, a drive circuit (not shown) for driving the display screen 151, and a connector 152 for connecting the display unit 15 to an external part. A double-coated adhesive tape 153 is applied on either side of the display screen 151 to attach the display unit to the display unit housing 16.

The display unit housing 16 has a front cover 161 for covering the front of the display unit 15 and a pair of side covers 162 for covering the sides of the display unit 15. The front cover 161 includes: a window 161a for inspection of the display screen formed in the part corresponding to the display screen 151 of the display unit 15; and two slits 161b formed above the window. A label 164 is attached to the front of the front cover 161 so as not to cover the slits 161b and the window 161a for inspection of the display screen. In addition, a pair of side covers 162 are installed by shafts 163 projecting outwards from both of the side covers 162. The shafts 163 are formed integrally with the side covers 162. The shafts 163 are fitted into a pair of supporting holes in the apparatus housing 11 shown in FIG. 1 so as to be freely rotatable.

FIG. 3 shows a method for attaching the display module to the apparatus housing.

FIG. 3 shows the housing 16 for the display unit as viewed from above, and a horizontal cross section of the apparatus housing 11.

The apparatus housing 11 has a pair of supporting holes 111 into which the shafts 163 of the housing 16 for display unit are fitted such that the housing 16 is supported by the apparatus housing 11 so as to be freely rotatable around the shafts 163.

To fit the shafts 163 into the supporting holes 111, it is preferable to make the portions equipped with the shafts 163, of the side covers 162 of the housing 16 for display unit, resilient in the directions indicated by the arrows A. With the portions of the side covers 162 resilient as such, the shafts 163 are fitted into the supporting holes 111 in the directions indicated by the arrows B. The pair of slits 161b in the front cover 161 of the housing 16 for the display module is formed so as to facilitate the resilient bending of the portions of the side covers 162 on which the shafts 163 are formed.

Although the display unit 15 is not shown here, the display module 14, with the display unit 15 affixed to the housing 16 with the double coated adhesive tapes 153, is supported by the apparatus housing 11 so as to be freely rotatable around the shafts 163.

A display module having the foregoing structure has suffered from the problems described below.

(1) During ESD (Electrostatic Discharge) tests, the discharge energy is transmitted directly to the display unit 15 via the slits 162 and the window 16 for inspection of the display screen, damaging the display unit 15.

(2) Pieces of double-coated adhesive tape 153 are used to attach the display unit 15 to the housing 16 for display unit, which is a time consuming process. In particular, if the display screen 151 is attached to the housing 16 at an angle, the pieces of tape must be peeled off and replaced with new ones, wasting many man-hours.

(3) When a product is disposed of, for recycling, the product has to be disassembled and the components have to be categorized. Because the conventional structures use pieces of double-coated adhesive tape to affix the display unit, disassembly requires many man-hours unless the person who does this task is knowledgeable about the holding structure of the display unit of the display module. Simply detaching the double-coated tape alone takes much time.

As a preventive measure against the ESD problems described above, Japanese Patent Application Laid-Open No. 11-251761 (patent document 1) employs a film sheet for covering display parts, such as an LED mounted on a printed circuit board.

However, a thin film sheet does not offer sufficient protection against ESD, while covering the display part with a thick film is unacceptable in view of structure.

Japanese Utility Model Application Publication No. 6-33502 discloses an illumination display device constituting a unit display for a group of display panels. The illumination display device has a plurality of members disposed in front of the LEDs, making the structure intricate. This may be effective in preventing the ESD problems. However, nothing is mentioned about the ESD problem in the above document. Furthermore, the intricate structure of the display device would make it too costly to employ.

SUMMARY

According to an aspect of the invention, a display module includes: a display unit having a display screen for displaying information; a display unit housing including a transparent front cover covering a display screen of the display unit, and a pair of side covers covering both sides of the display unit, wherein the display unit is attached to the display unit housing so as to be detachable; and shafts projecting outwards from the pair of side covers and supported so as to be freely rotatable when fitted in a pair of supporting holes made in a housing provided for an apparatus.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DETAILED DESCRIPTION OF THE EMBODIMENTS

Figure 1:
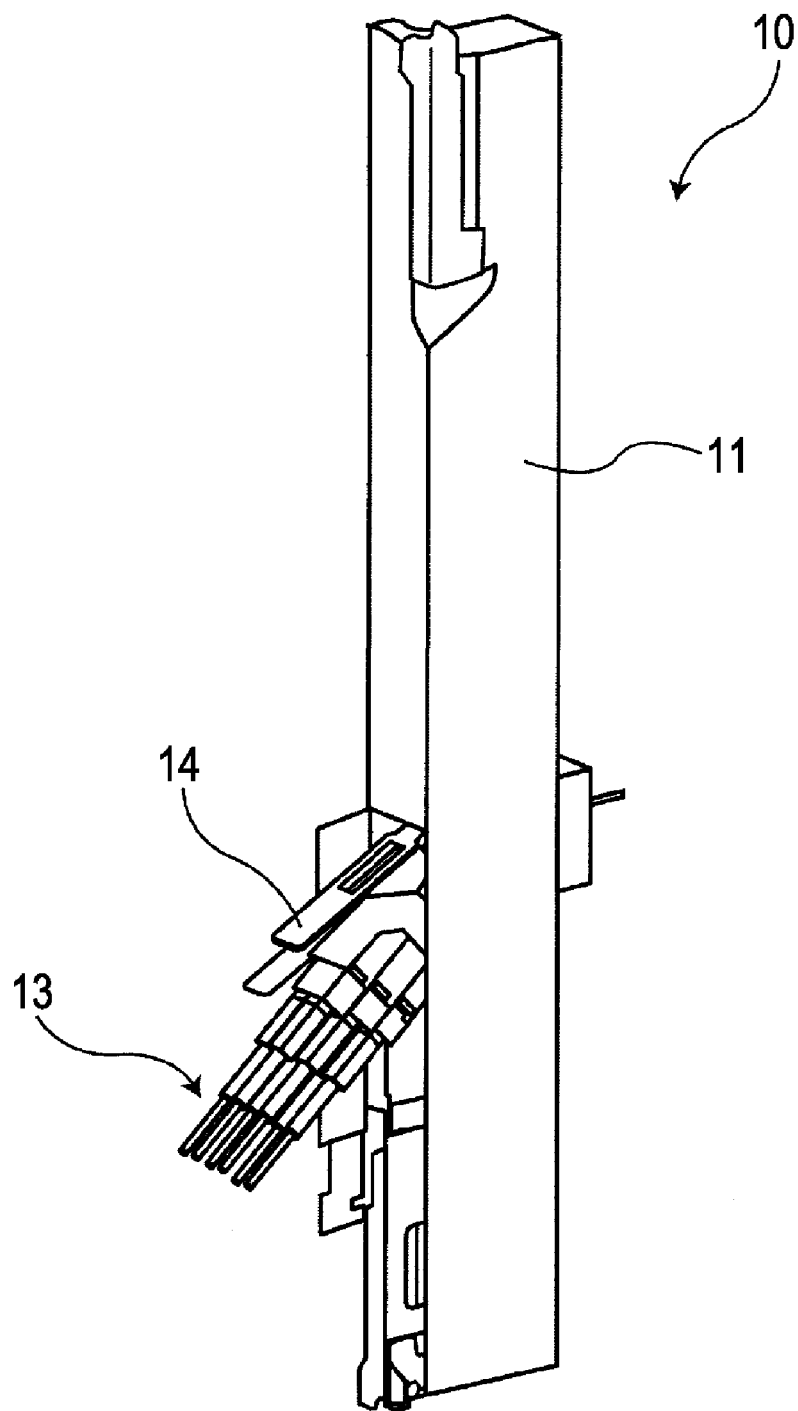
FIG. 1 shows an example of an apparatus housing to which optical cables are connected.

Embodiments will hereinafter be described below.

An embodiment provides a display module that is highly resistant to electrostatic discharge despite a comparatively simple structure and that is easy to assemble or disassemble.

A display module according to an embodiment includes: a display unit having a display screen for displaying information; a display unit housing including a transparent front cover covering a display screen of the display unit, and a pair of side covers covering the whole surfaces of both sides of the display unit, wherein the display unit is attached to the display unit housing so as to be detachable; and shafts projecting outwards from the pair of side covers and supported so as to be freely rotatable by its being fitted in a pair of supporting holes formed in the housing apparatus.

The display module of the embodiment has the display unit housing that includes the front cover for entirely covering the display screen side of the display unit, and the pair of side covers for entirely covering the sides of the display unit. This protects the display unit from direct exposure to electrostatic discharge, making the structure highly resistant to electrostatic discharge. In addition, the visibility of the front of the display screen is ensured by using a light transmitting material for at least part of the display unit housing, which covers the front of the display screen. Furthermore, display unit is attached to the display unit housing so as to be detachable. This eliminates the need for replacement of double coated adhesive tape, and reduces assembling/disassembling man-hours.

In the display module according to the embodiment described above, the display unit housing preferably includes a first housing having the pair of side covers and the shafts formed integrally with the side covers, wherein the display unit is attached to the first housing so as to be detachable; and a second housing having the front cover, wherein the first housing is attached to the second housing so as to be freely detachable.

The two separate housings include the first housing having the front cover, and the second housing accepting the display unit and having the side covers and shafts. This makes the assembly and disassembly of the display easier, and eliminates the need for slits for bending the resilient portions.

In the display module according to the embodiment described above, the display unit housing is configured such that the front cover and the pair of side covers are integrally formed, the display unit is attached to the display unit housing so as to be detachable, and the pair of side covers have insertion holes into which the shafts are inserted. The shafts may be a spring-loaded axially compressible/extendible shaft that is inserted in the insertion holes and projects outwards from the pair of side covers.

Where the front cover and the pair of side covers are integrally formed, how to bend the shafts becomes a problem. In this case, a shaft is provided separately from the display unit housing. The shaft has a freely compressible/extendible structure, thus eliminating the need for slits, thereby making the structure highly resistant to electrostatic discharge.

The assembling/disassembling is easy in much the same way as the embodiment described above.

In the display module according to the embodiment, the display unit housing is configured such that the front cover and the pair of side covers are integrally formed; the display unit is attached to the display unit housing so as to be detachable; the shafts are formed integrally with the side covers; and the side covers have first slits near the front cover so that resilient shaft areas of the side covers are bent inward. In addition, the display unit housing is provided with a cap member including a base part for covering the upper end face of the display unit attached to the display unit housing, and a pair of side parts that overlap the pair of side covers and cover the first slits, each of the side parts having a second slit into which the corresponding shaft fits.

In this case, slits have to be provided in the display unit housing so that the resilient side cover parts may be bent inward to install the shafts. However, on account of the cap member that covers the slits, this embodiment is highly resistant to electrostatic discharge. Assembling/disassembling is as easy as the embodiment described above.

A display unit according to any of the above embodiments may have LED for displaying information on the display screen by illumination. Also, the display unit housing may be formed by molding a resin. Furthermore, the display module according to this embodiment may preferably have a label attached to cover the front of the front cover except the area in front of the display screen.

According to the above embodiments, it is possible to manufacture a display module which has a good ESD resistance and which is easy to assemble and disassemble.

Figure 4:
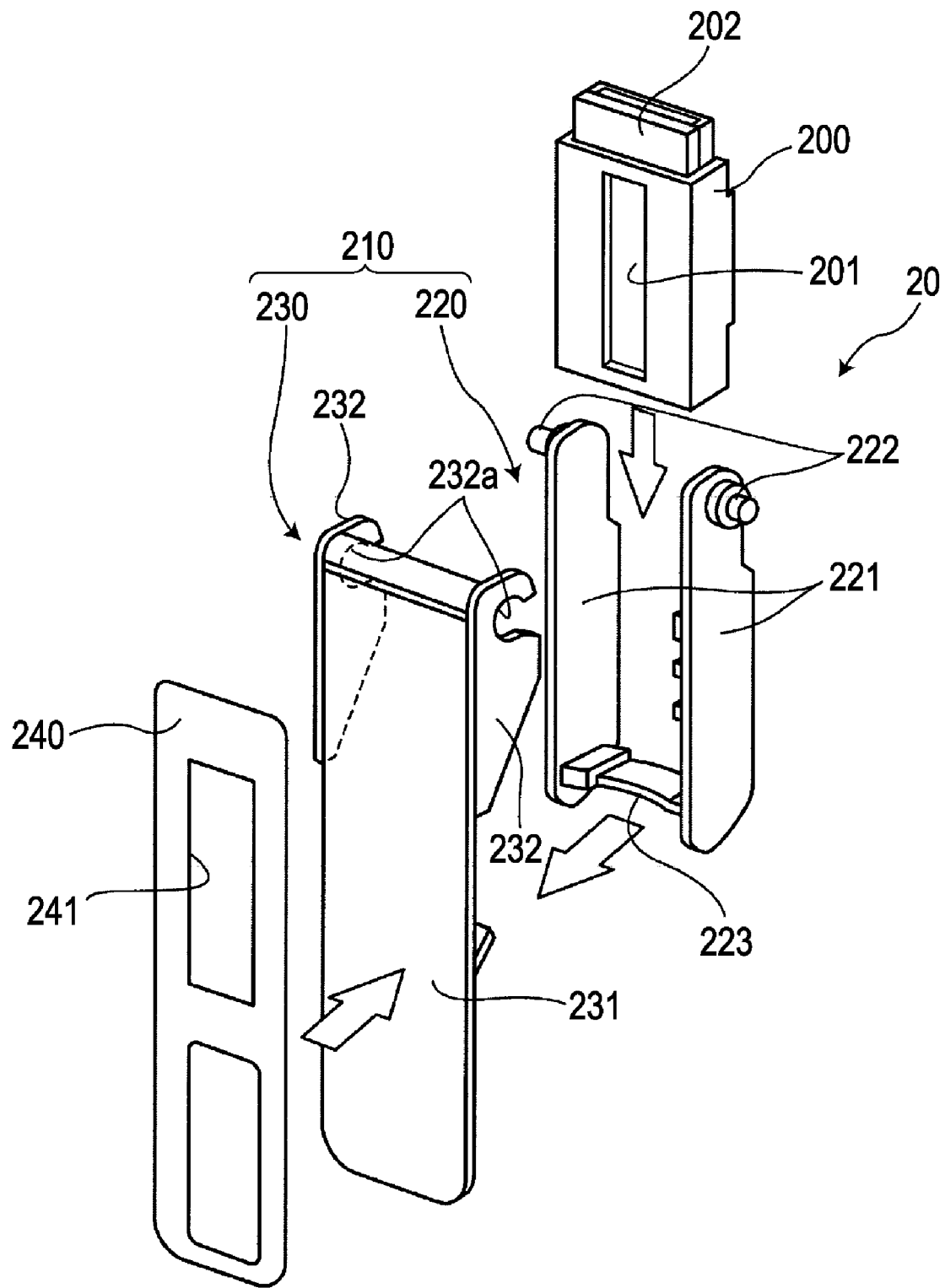
FIG. 4 is an exploded perspective view of a display module according to the first embodiment.

FIG. 4 is an exploded perspective view of a display module according to the first embodiment of the present invention.

The display module 20 shown in FIG. 4 includes a display unit 200, a housing 210 for the display unit, and a label 240. The housing 210 for the display unit has two members: a first housing 220 and a second housing 230.

Figure 2:
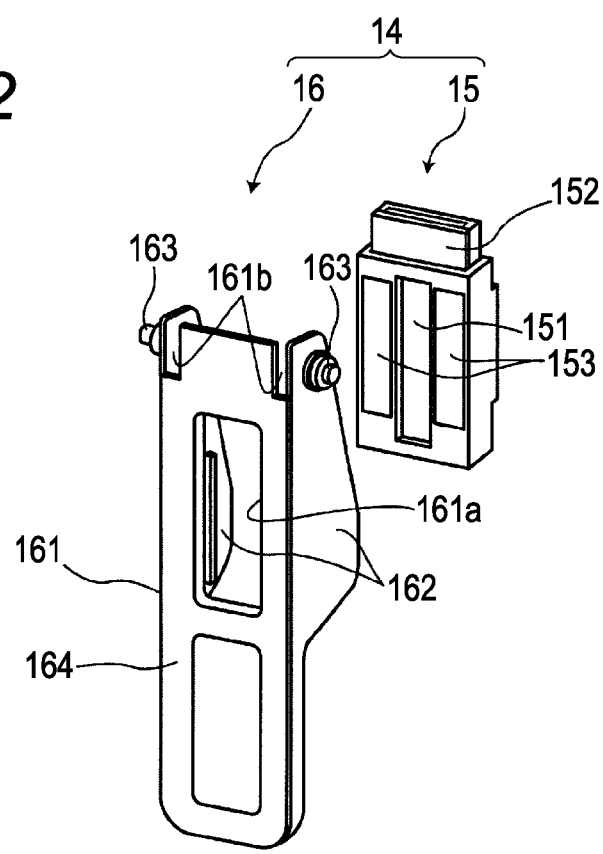
FIG. 2 is an exploded perspective view of a display module.

The display unit 200 is structured in the same way as the above mentioned conventional type of display unit 15 (see FIG. 2) and includes a display screen 201 with an array of LED segments, a drive circuit (not shown) for driving the array of LED segments in the display screen 201, and a connector 202 for connecting the display unit 200 to an external part.

Figure 3:
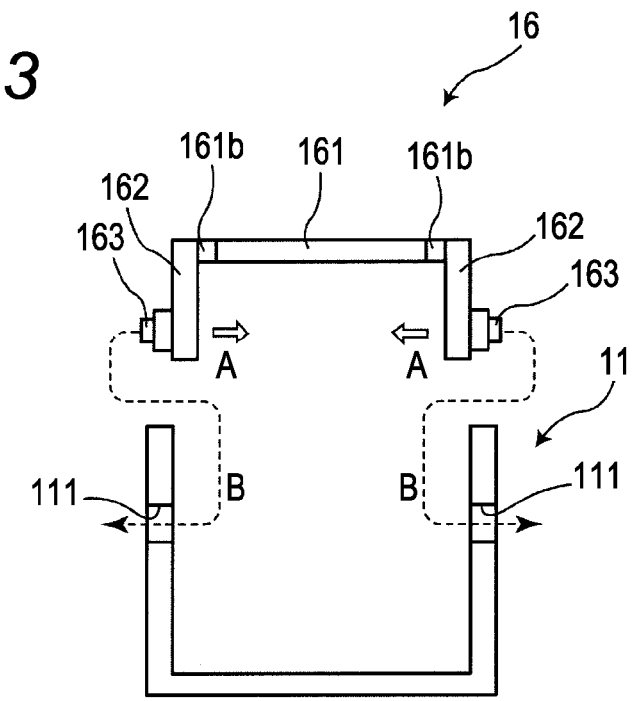
FIG. 3 is a view illustrating a method for mounting the display module to the apparatus housing.

The first housing 220 composing the display unit housing 210 is made of a transparent resin, the same material of which the second housing 230 is made (see discussion below), and the removable display unit 200 is attached to the first housing 220. The first housing includes a pair of side covers 221 for entirely covering both sides of the display unit 200, shafts 222 projecting outward from the side covers 221, and a connecting part 223 for connecting the pair of side covers 221 at their lower ends. This structure makes bending the resilient first mounting housing inward at the shaft 222 portions possible, and allows the shafts 222 to be inserted easily through the supporting holes 111 (see FIG. 3) in the apparatus housing 11.

The supporting structure of the first housing 220 for the display unit 200 will be discussed below.

The second housing 230 composing the display unit housing 210 is made of a transparent resin. The second housing includes a front cover 231 which covers the whole surface of the display screen 201 side of the display unit 200; and a pair of shaft supporting parts 232 which overlap the side covers 221 of the first housing 220 and which have shaft supporting slits 232a for accommodating the shafts 222 of the first housing 220. The second housing 230 is structured to accommodate the first housing 220 with the display unit 200 already supported therein. This supporting structure will be discussed later.

A label 240, which also serves to provide a warning, is attached to the front of the second mounting housing 230. The label 240 is supported by the first housing 220 and has an opening 241 to provide a window for inspecting the display screen. The opening 241 is defined in a part corresponding to the front of the display screen 201 of the display unit 200 supported by the second housing 230. The label is opaque, thereby covering the unnecessary portions of the display unit housing 210 so as to make them unviewable from outside.

Figure 5:
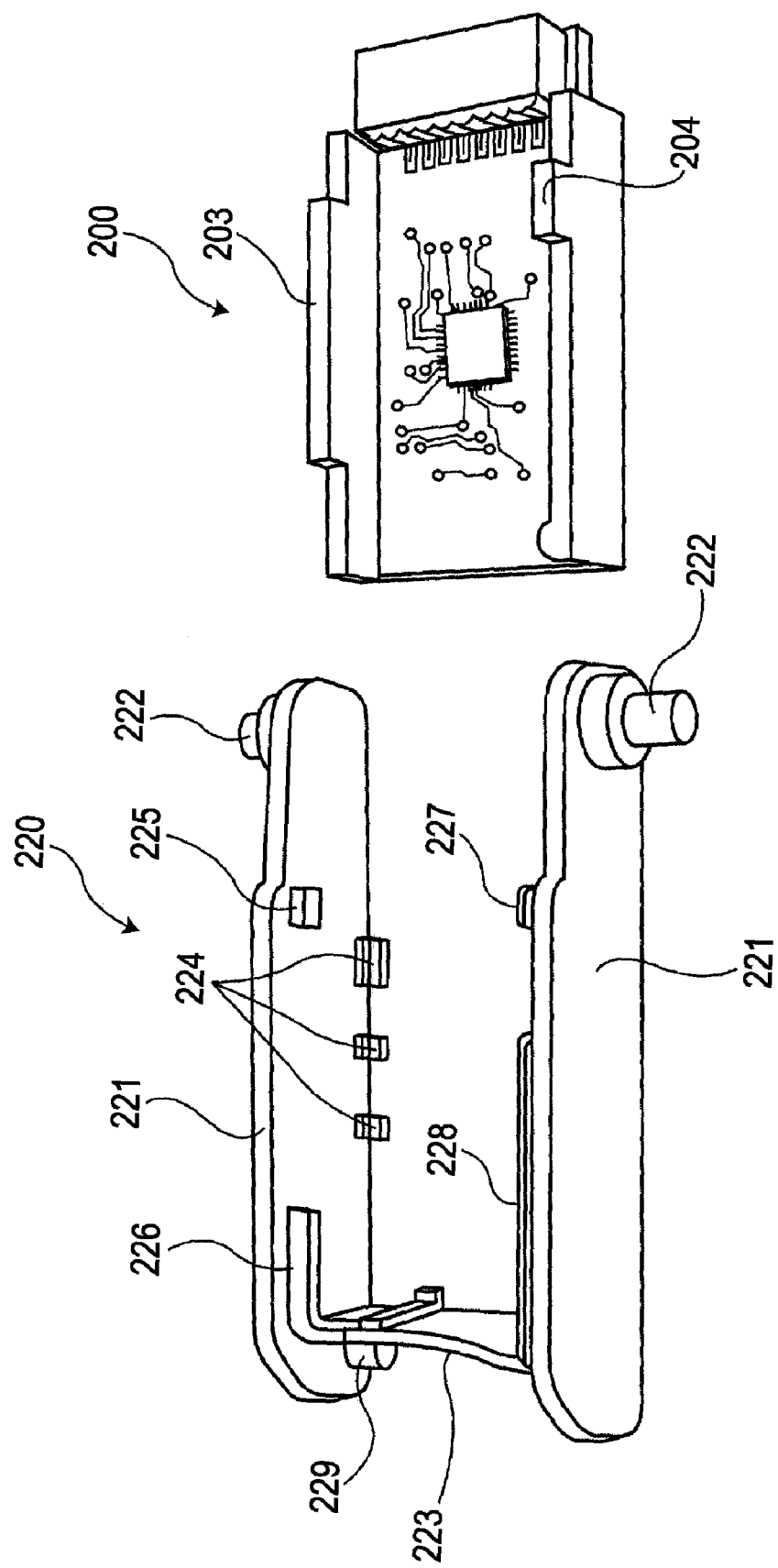
FIG. 5 is a perspective view of the display unit and a first housing placed side by side.
Figure 6:
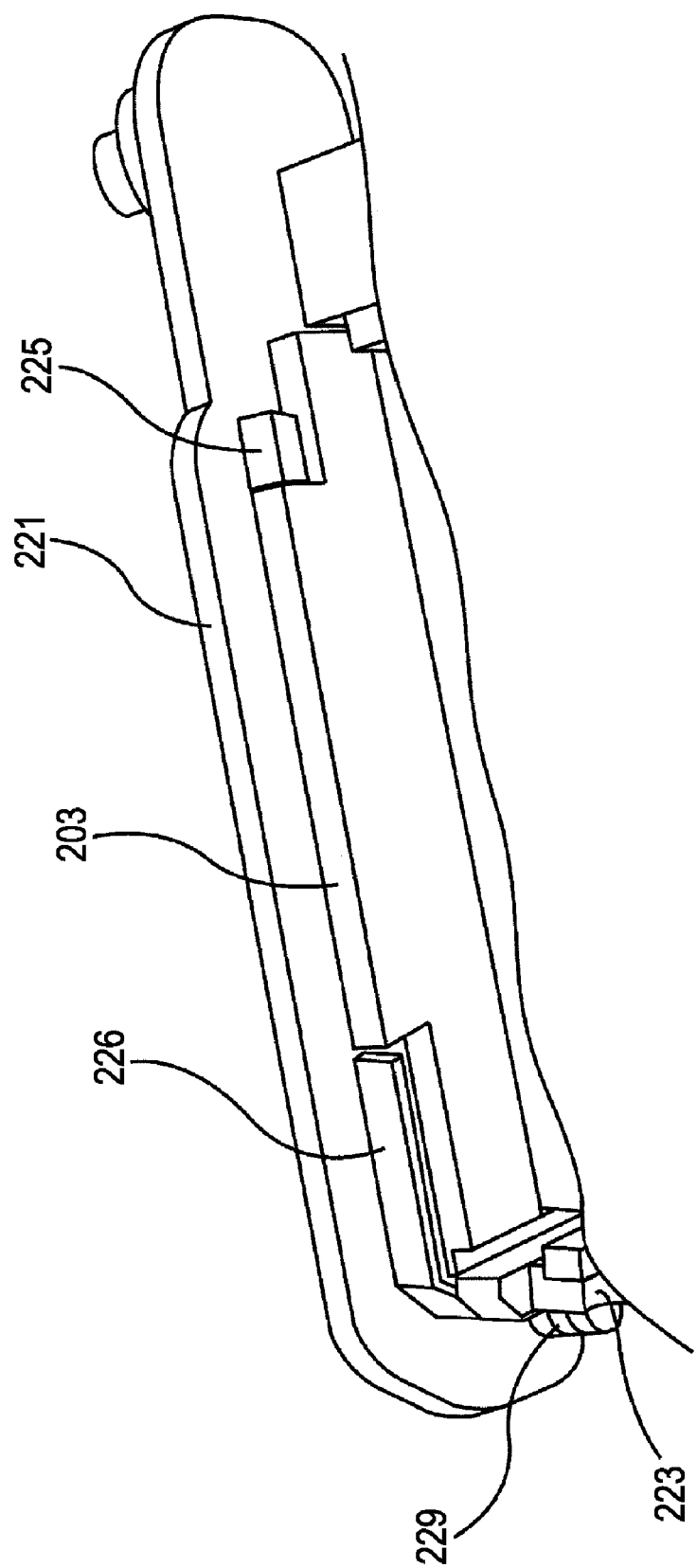
FIG. 6 is a partial perspective view of the first housing with the display unit mounted therein.

FIG. 5 is a perspective view of the display unit 200 and the first housing 220 placed side by side. FIG. 6 is a partial perspective view of a portion of the first housing 220 with the display unit 200 mounted therein.

Each of the pair of side covers 221 of the first housing 220 has support bases 224 for supporting the respective edges of the front (i.e., the bottom in FIG. 5) of the display screen of the display unit 200. Each of the pair of side covers 221 of the first housing 220 also has a pair of supporting projections 225 and 226, 227 and 228, respectively.

The display unit 200 has a projection 203 that fits between the pair of supporting projections 225 and 226, and a projection 204 that fits between the projections 227 and 228. The display unit 200 is supported by the support bases 224 in contact with the connecting part 223 such that the projections 203 and 204 fit between the pair of support bases 225 and 226, and the pair of support bases 227 and 228, respectively. Meanwhile, a projection 229 formed on the surface of the external wall of the connecting part 223 of the first housing 220 is for supporting the second housing 230. Details will be described below.

FIG. 6 shows the projection 203 engaging with one of the pairs of supporting projections, 225 and 226.

In the first housing 220, two side covers 221 connect with the connecting part 223 in a cantilever manner, so the two resilient side covers 221 can be bent outward for mounting the display unit 200 between the side covers 221 with ease. Furthermore, in the two side covers 221 of the first housing 200, the resilient leading ends having the projecting shafts 222 may be bent inward, even with the display unit 200 mounted in the first housing 220. Accordingly, the shafts 222 can be inserted through the supporting holes 111 (see FIG. 3) in the apparatus housing with ease.

Figure 7:
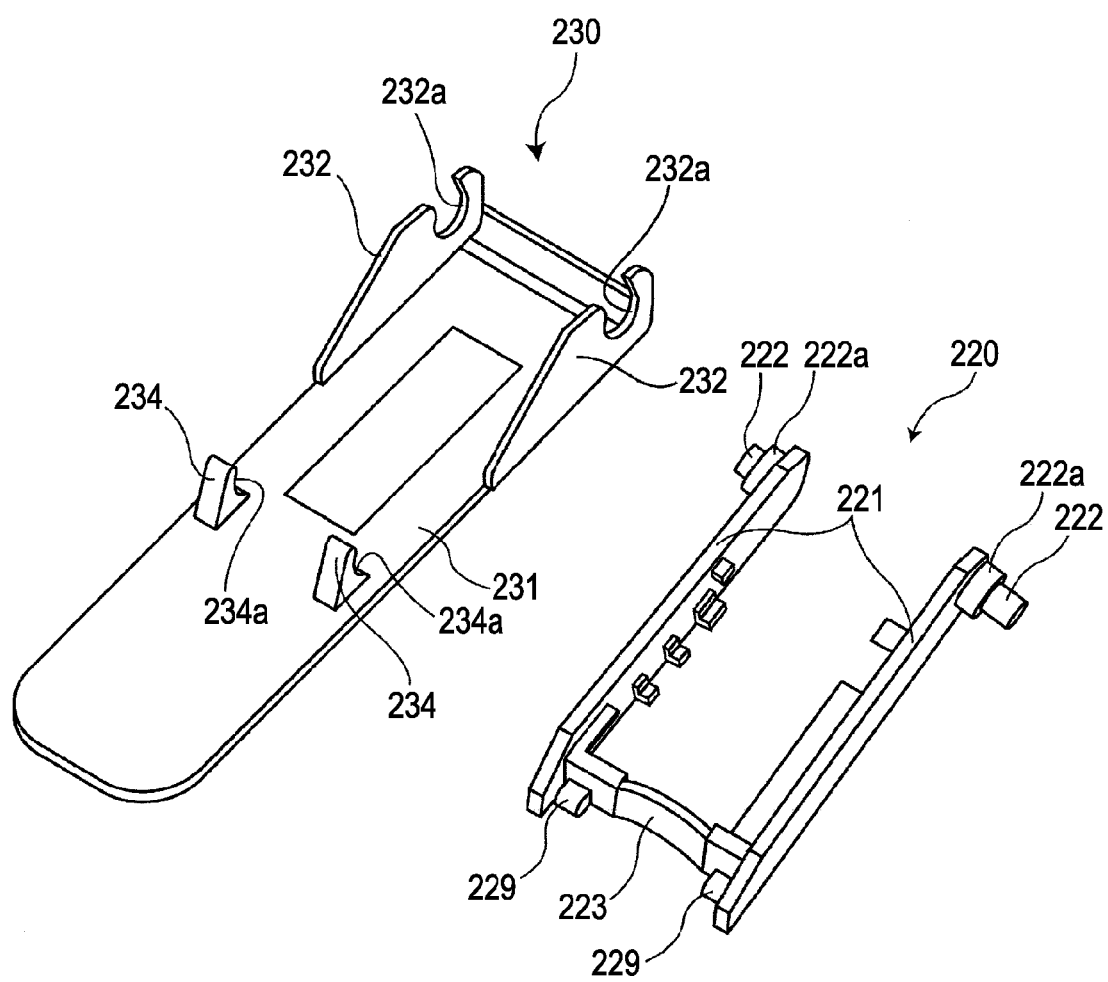
FIG. 7 is a perspective view of the first housing and a second housing placed side by side.
Figure 8:
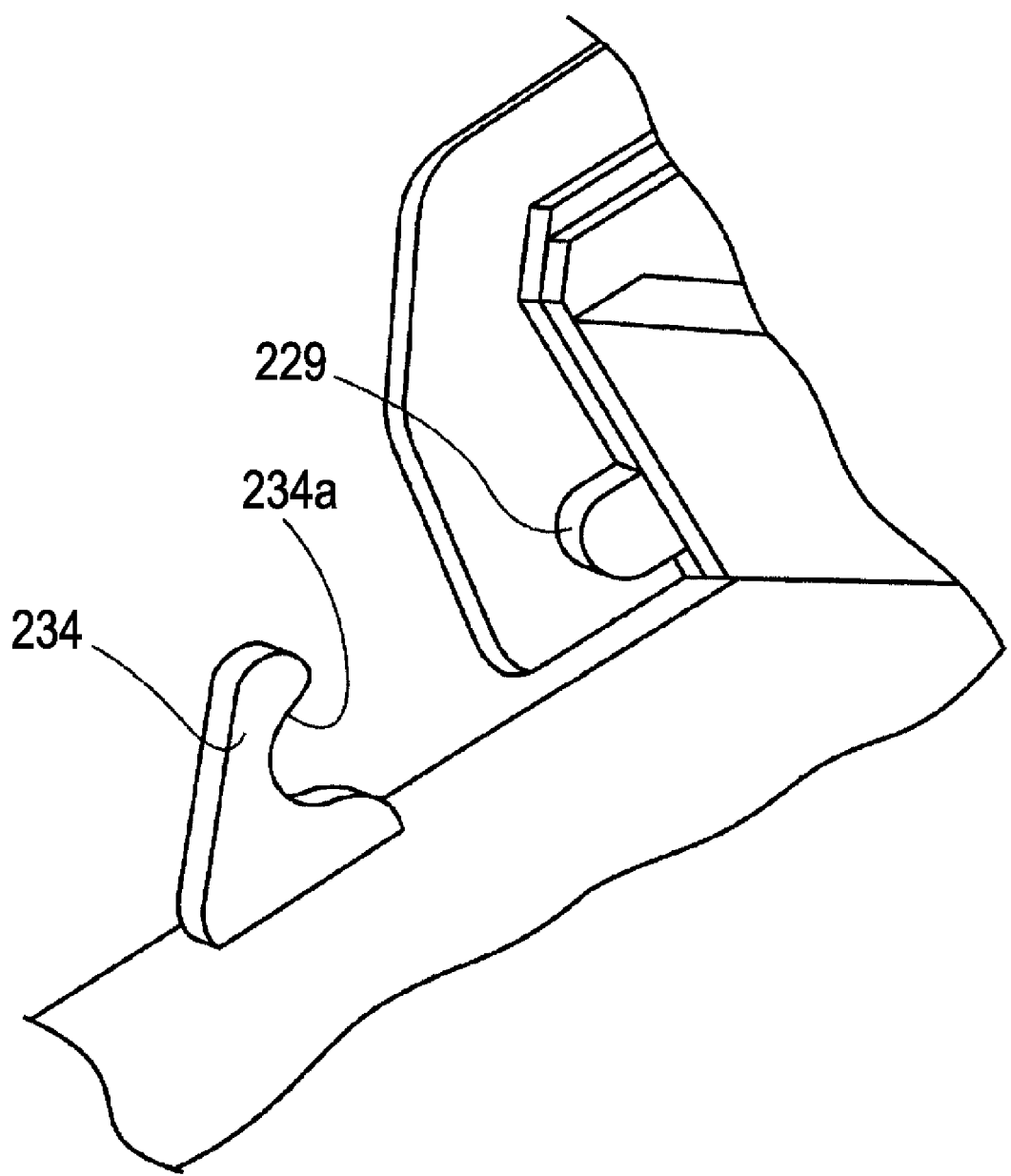
FIG. 8 is a partial perspective view of a connecting portion between the first and second housings.
Figure 9:
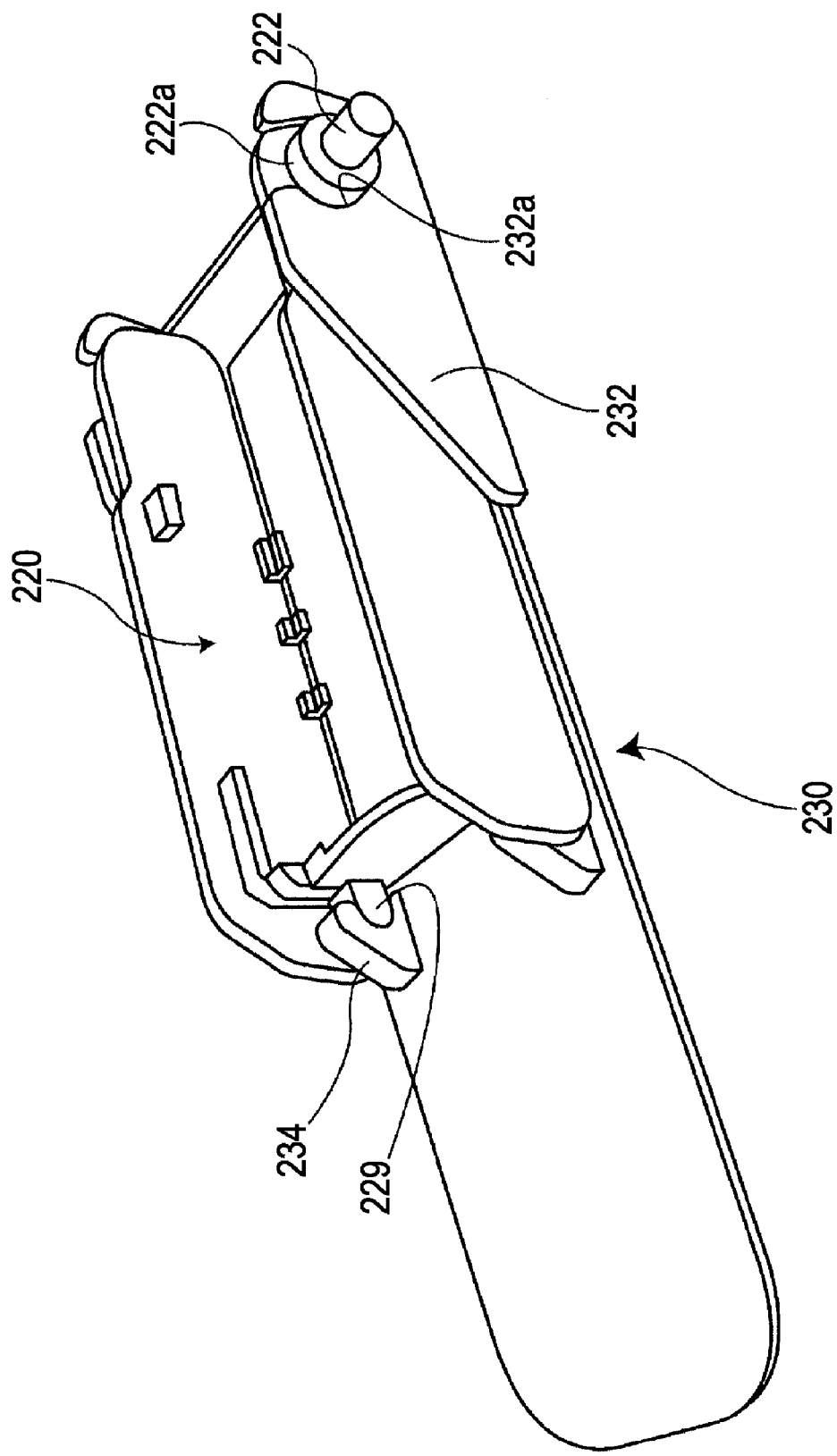
FIG. 9 is a perspective view of the first and second housings connected together.

FIG. 7 is a perspective view of the first and second housings placed side by side. FIG. 8 is a partial perspective view of a connecting portion between the first and second housings. FIG. 9 is a perspective view of the first and second housings connected with each other.

The first housing 220 has two projections 229 on the surface of the external wall of the connecting part 223, while the second housing 230 has two receiving parts 234, each having a recess 234a into which the projection 229 fits. FIG. 8 shows the projection 229 immediately before fitting into the recess 234a of the receiving part 234.

To mount the first housing 220 to the second housing 230, the projections 229 of the first housing 220 are fitted into the recesses 234a of the corresponding receiving parts 234 of the second housing 230, then the large diameter portions 222a at the roots of the shafts 222 are engaged with shaft supporting grooves 232a in the shaft supporting parts 232 of the second housing 230. Thus, the first housing 220 is mounted on the second housing 230.

In the foregoing, a description is given of the connection of the first housing 220 to the second housing 230, without the display unit 200 in the first housing 220. In use, however, the display unit 200 is supported by the first housing 220, and the first housing 220 with the display unit 200 mounted therein is supported by the second housing 230. When the first housing 220 is fitted to the second housing 230, the shafts 222 are kept somewhat inwardly bent. Being installed in such a way, the display unit 200 will be elastically held from both sides by the side covers 221 of the first housing 220. Consequently the display unit 200 is kept in place without any undesirable play.

According to the first embodiment, since the holding structure relies on fitting and the materials used are transparent, the construction can be easily understood and disassembly can be performed with ease without prior knowledge.

Furthermore, according to the foregoing structure, the side covers 221 of the first housing 220 lie inside the supporting part 232 of the second housing 230. Accordingly, the portions of the side covers 221, in which the shafts 222 are formed, can be bent inward, making the shafts 222 fit through the supporting holes 111 in the apparatus housing 11 more easily.

Figure 10:
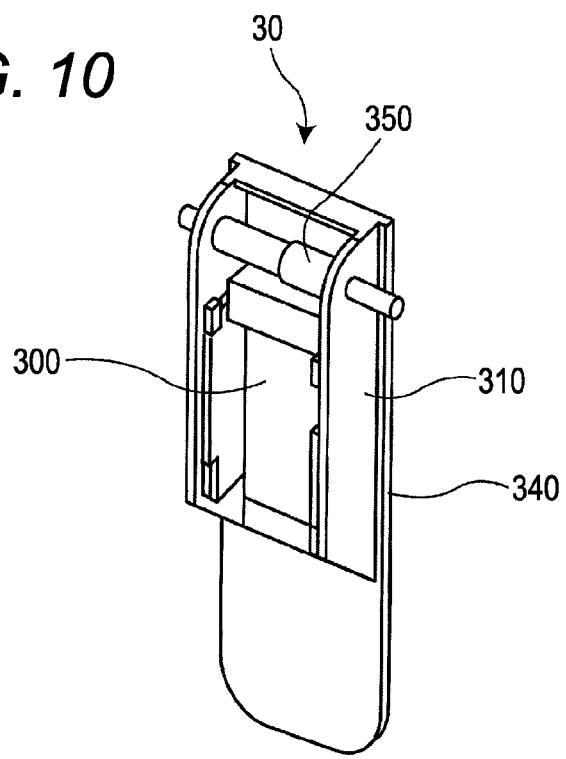
FIG. 10 is a perspective view of an assembled state of a display module according to the second embodiment.
Figure 11:
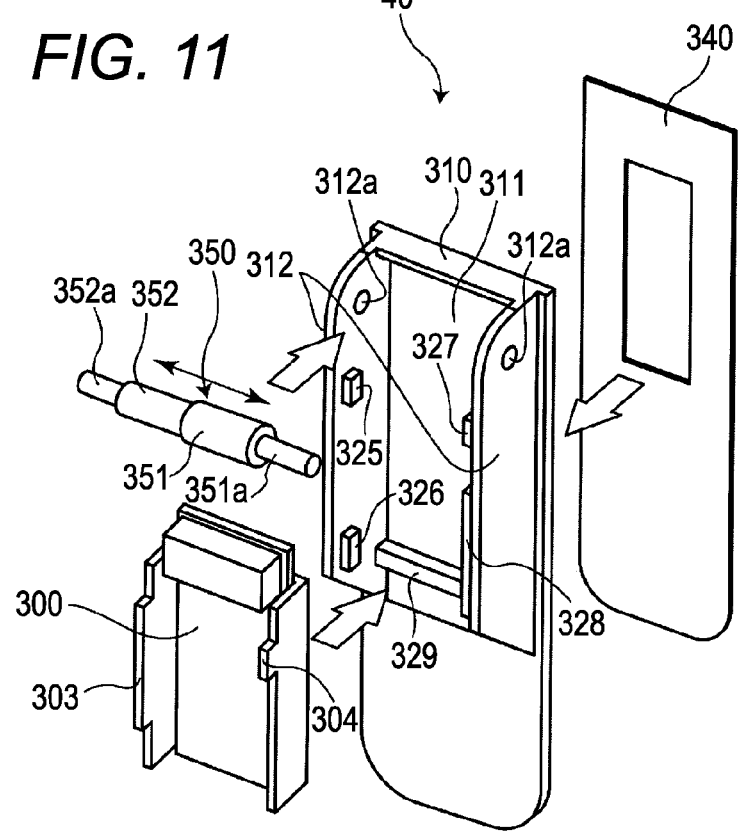
FIG. 11 is an exploded perspective view of the display module in the second embodiment.

FIG. 10 is a perspective view of an assembled state of a display module according to the second embodiment. FIG. 11 is an exploded perspective view of the display module shown in FIG. 10. FIGS. 10 and 11 are rear perspective views of the display module.

The display module 30 shown in FIGS. 10 and 11 includes a display unit 300, a housing 310 for the display unit, a label 340, and a shaft member 350. The display unit 300 is of the same configuration as the display unit 200 of the first embodiment (see FIG. 9) described above. Projections 303 and 304 correspond to the projections 203 and 204, respectively, of display unit 200 shown in FIG. 5. Likewise, the label 340 is identical to the label 240 (see FIG. 4) of the display module 20 of the first embodiment.

Unlike the housing 210 for the display unit composing the display module 200 in the first embodiment, the housing 310 for the display unit composing the display module 300 in the second embodiment is constructed with one member.

To be specific, the housing 310 for the display unit in the display module 200 according to the second embodiment is made of a transparent resin, and has a front cover 311 entirely covering the front of the display unit 300, and a pair of side covers 312 entirely covering the left and right sides of the display unit 300. Each of the side covers 312 has an insertion hole 312a, through which the shaft member 350 is passed.

Of the two side covers 312, one side cover has a pair of supporting projections 325 and 326 while the other side has a pair of supporting projections 327 and 328. These supporting projections 325 and 326 and supporting projections 327 and 328 correspond to the supporting projections 225 and 226 and supporting projections 227 and 228, respectively, of the first housing 220 of the first embodiment (see FIG. 5, for example). The supporting projections 325 and 326, and 327 and 328 are for supporting and keeping the display unit 300 in place, with the projections 303 and 304 fitted between the projections 325 and 326 and supporting projections 327 and 328, respectively.

In the housing 310 of the second embodiment, a projecting engagement bar 329 is formed and corresponds to the connecting part 223 of the first housing 220 in the first embodiment. The engagement bar 329 supports the bottom edge of the display unit 300 mounted in the housing 310.

Thus, the housing 310 for the display unit according to the second embodiment has a supporting structure identical to that in the first embodiment, except that the housing is constructed with one member.

Figure 12:
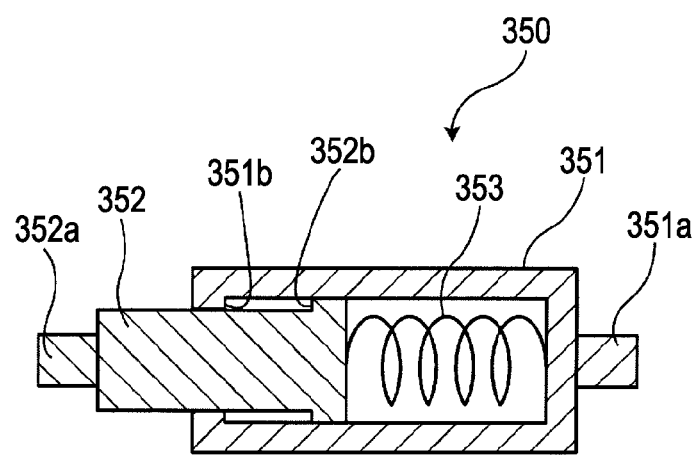
FIG. 12 shows the structure of the inside of a shaft member in the second embodiment.

FIG. 12 shows the structure of the inside of the shaft member, the outer shape of which is shown in FIG. 11.

The shaft member 350 includes a cylindrical member 351, piston-like member 352, and a coil spring 353.

The cylinder 351 has a shaft 351a on an end face, which fits into a supporting hole 111 (see FIG. 3) in the apparatus housing 11. The cylinder is a hollow cylinder with a coiled spring 351 accommodated within.

The leading end of the piston-like member 352 enters into the hollow of the cylindrical member 351 and compresses the coiled spring 353. Formed on the trailing end of the piston-like member is a shaft 352a, which fits into a supporting hole 111 of the apparatus housing 11.

A projection 351b is formed at the mouth of the hollow cylinder member 351. Another projection, 352b, is formed at the leading end of the piston-like member 352 so that the projection 352b engages with the projection 351b in the cylindrical member 351, thereby preventing the piston-like member 352 from coming off.

The shaft member 350 shown in FIG. 12 is freely compressible and extendable lengthwise. Compressing the shaft member 350 makes inserting the two shaft parts 351a and 352a through the two corresponding insertion holes 312a in the display unit housing 310 possible. In addition, compressing the shaft member 350 also makes fitting the shaft parts 351a and 352a into the supporting holes 111 of the apparatus housing 11 possible.

The second embodiment also ensures high resistance to electrostatic discharge because the display unit housing for the display unit entirely covers the front as well as the entire sides of the display unit. The second embodiment also has a structure in which assembly and disassembly are easily performed.

Figure 13:
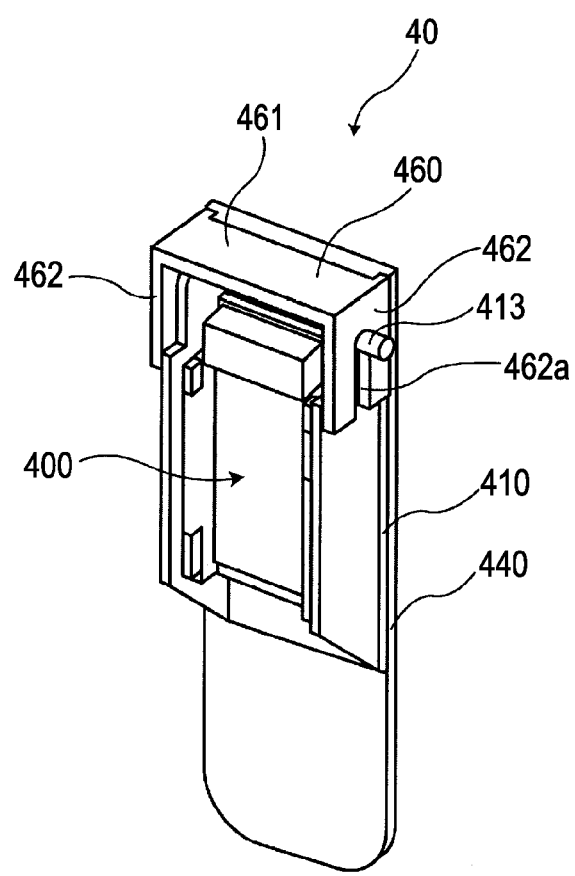
FIG. 13 is a perspective view of the assembled state of a display module according to the third embodiment.
Figure 14:
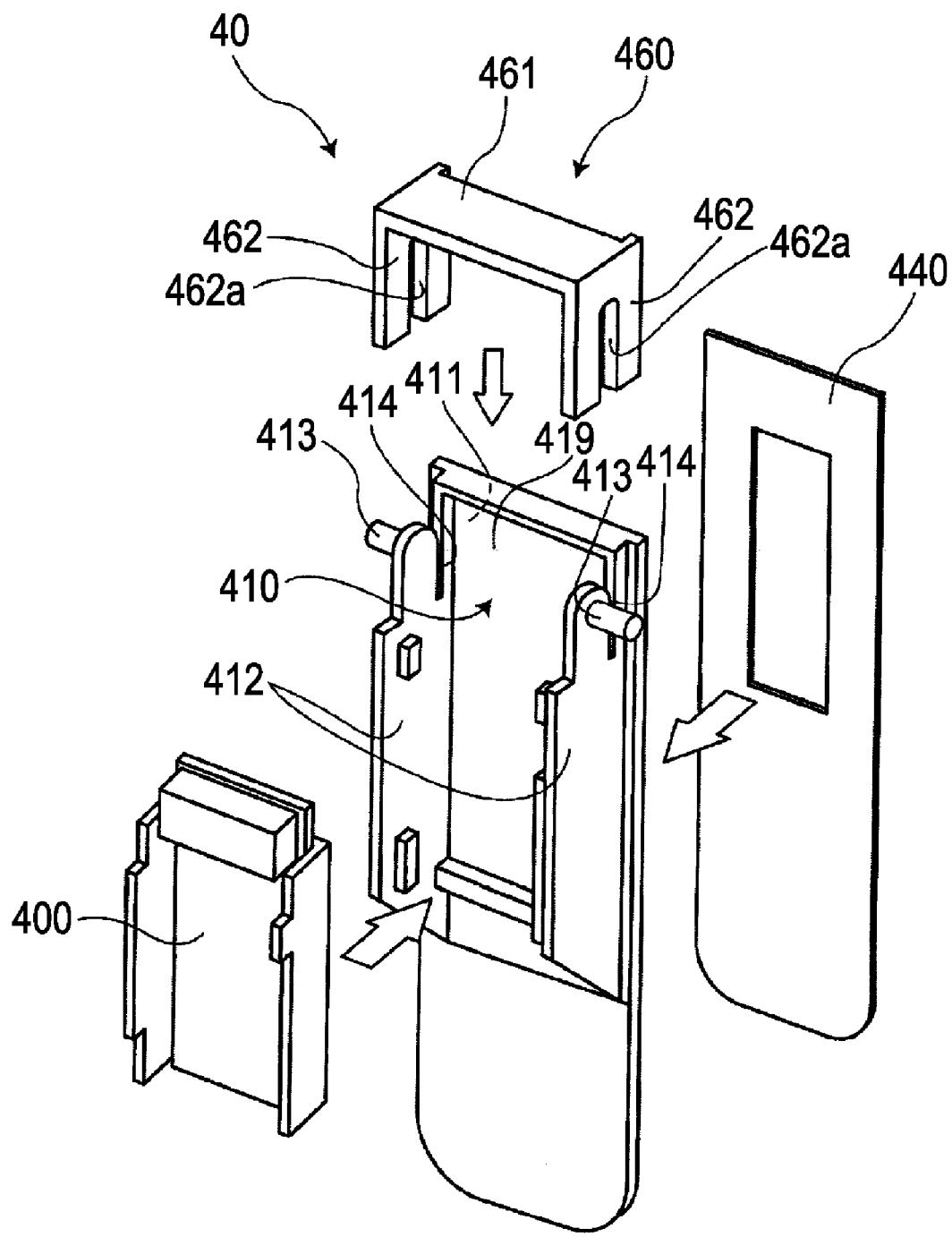
FIG. 14 is an exploded perspective view of the display module in the third embodiment.

FIG. 13 is a perspective view of the assembled state of a display module in the third embodiment. FIG. 14 is an exploded perspective view of the display module shown in FIG. 13. FIGS. 13 and 14 are rear perspective views of the display module.

The display module 40 shown in FIGS. 13 and 14 includes a display unit 400, a housing 410 for the display unit, a label 440, and a cap 460.

The construction of the display unit 400 is identical to that of the display units 200 and 300 in the first and second embodiments, respectively. Thus, description will not be repeated here.

The label 440 is also identical to the labels 240 and 340 in the first and second embodiments, respectively. Thus, description will not be repeated here.

The housing 410 for the display unit according to the third embodiment is identical to the housing according to the second embodiment shown in FIGS. 10 and 11 insofar as the housing 410 for display unit is formed from a single transparent resin member having a front cover 411 and a pair of side covers 412, and the mounting structure for the display unit 400 is identical to that in the second embodiment shown in FIGS. 10 and 11. What differs from the housing 310 of the second embodiment (see FIG. 11) is described below.

The housing 410 for the display unit according to the third embodiment includes a pair of side covers 412, each integrally formed and each having a shaft 413 projecting outward from the upper part of the side cover. Each side cover also has a slit 414 adjacent to a front cover 411 so that the resilient shaft 413 area of the side cover may be bent inward.

According to the third embodiment, a cap member 460 is provided to cover slits 414. The cap member 460 includes a base part 461 for covering the upper end face of the display unit 400, and a pair of side parts 462, each of the side parts having a slit 462a into which shaft 413 fits. Putting the cap 460 on in the way as shown in FIG. 13 covers the slits 414.

The display module shown in FIGS. 13 and 14 is also highly resistant to electrostatic discharge and easy to assemble or disassemble.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A display module comprising:
   a display unit to include a display screen for displaying information;
   a display unit housing to include a transparent front cover covering the display screen of the display unit, and a pair of side covers entirely covers both sides of the display unit, wherein the display unit is attached to the display unit housing so as to be detachable; and shafts to project outwards from the pair of side covers and supported so as to be freely rotatable when fitted in a pair of supporting holes in a housing for another housing or the display unit housing.

2. The display module according to claim 1, wherein the display unit housing includes:

a first housing having the pair of side covers and the shafts formed integrally with the side covers, wherein the display unit is attached to the first housing so as to be detachable; and a second housing having the front cover, wherein the first housing is attached to the second housing so as to be freely detachable.

3. The display module according to claim 1, wherein the display unit housing is configured such that the front cover and the pair of side covers are integrally formed, the display unit is attached to the display unit housing so as to be detachable, and the pair of side covers have insertion holes into which the shafts are inserted, wherein the shafts are spring-loaded axially compressible/extendible shafts that are inserted in the insertion holes and project outwards from the pair of side covers.

4. The display module according to claim 1, wherein the display unit housing is configured such that: the front cover and the pair of side covers are integrally formed; the display unit is attached to the display unit housing so as to be detachable; the shafts are formed integrally with the side covers; and the side covers have first slits near the front cover so that the resilient portions with shafts of the side covers are bent inward, and wherein the display unit housing is provided with a cap member including a base part for covering the upper end face of the display unit attached to the display unit housing, and a pair of side parts that overlap the pair of side covers and cover the first slits, each of the pair of side parts having a second slit into which the corresponding shaft fits.

5. The display module according to claim 1, wherein the display unit has an LED and displays information on the display screen by illumination of the LED.

6. The display module according to claim 1, wherein the display unit housing is formed by molding a resin.

7. The display module according to claim 1, wherein a label is affixed to the front of the front cover except over an area in front of the display screen.

* * * * *